United States Patent [19]
Bishop et al.

[11] Patent Number: 6,086,779
[45] Date of Patent: Jul. 11, 2000

[54] COPPER ETCHING COMPOSITIONS AND METHOD FOR ETCHING COPPER

[75] Inventors: Craig V. Bishop, Lakewood; John R. Kochilla, Cleveland; Robert J. Durante, Parma Hts.; George S. Bokisa, North Olmstead, all of Ohio

[73] Assignee: McGean-Rohco, Inc., Cleveland, Ohio

[21] Appl. No.: 09/260,169

[22] Filed: Mar. 1, 1999

[51] Int. Cl.[7] .................................................. C23F 1/00
[52] U.S. Cl. .......................... 216/93; 216/13; 216/20; 216/34; 216/105; 252/79.2; 252/79.4
[58] Field of Search .................... 252/79.2, 79.4; 216/13, 20, 34, 93, 105; 438/754

[56] References Cited

U.S. PATENT DOCUMENTS

| | | | |
|---|---|---|---|
| 3,650,957 | 3/1972 | Shipley et al. | 252/79.4 X |
| 4,280,887 | 7/1981 | Konstantouros | 204/150 |
| 4,395,302 | 7/1983 | Courduvelis | 156/642 |
| 4,466,859 | 8/1984 | Nelson | 156/646 |
| 4,525,240 | 6/1985 | Elias et al. | 252/79.2 X |
| 4,545,877 | 10/1985 | Hillis | 204/130 |
| 4,636,282 | 1/1987 | Wong | 156/659.1 |
| 5,279,641 | 1/1994 | Narisawa et al. | 75/353 |
| 5,358,602 | 10/1994 | Sutcliffe et al. | 156/656 |
| 5,554,211 | 9/1996 | Bokisa et al. | 106/1.22 |
| 5,620,612 | 4/1997 | Kukanskis et al. | 216/18 |
| 5,747,098 | 5/1998 | Larson | 427/58 |

*Primary Examiner*—William Powell
*Attorney, Agent, or Firm*—Renner, Otto, Boiselle & Sklar

[57] ABSTRACT

This invention relates to an aqueous etching composition for etching metallic copper comprising (a) an acid,
(b) a copper complexing agent,
(c) a metal capable of having a multiplicity of oxidation states which is present in one of its higher positive oxidation states and which metal forms a composition soluble salt, and
(d) oxygen wherein the concentration of the higher positive oxidation state metal in the composition is greater than about 4 grams/liter of composition.

The invention also relates to a process for etching metallic copper comprising contacting the surface of a copper substrate with the aqueous etching compositions of the invention. A method of regenerating a spent aqueous etching composition of the invention which has been used for etching metallic copper also is described.

31 Claims, No Drawings

1

COPPER ETCHING COMPOSITIONS AND METHOD FOR ETCHING COPPER

FIELD OF THE INVENTION

This invention relates to aqueous etching compositions for etching metallic copper, to methods for etching metallic copper, metallic copper which has been etched by contact with the aqueous etching compositions of the invention, and to a method of regenerating the spent aqueous copper etching compositions of the present invention.

BACKGROUND OF THE INVENTION

Etching of metals, and particularly of copper, is carried out in a large number of industrial processes, both for the cleaning of copper surfaces, and in order to provide a desired pattern on the copper surface. An example of the application of the later technique is in the production of "printed circuits" in which a layer of copper on an insulated substrate is etched away in predetermined areas to provide a desired pattern of conducting copper on the surface of the insulating substrate.

Copper which is used in printed wiring board (PWB) or printed circuit board (PCB) fabrication often is etched prior to processes such as the application of resists or the application of bonding agents such as oxides, immersion tin, or coupling agents such as silane. The etching results in a physical roughening of the copper surface which provides increased surface areas for bonding.

A variety of etching compositions have been suggested in the prior art for the production of printed circuit boards, and these etching compositions include ferric chloride, cupric chloride, various ammoniacal etchants, etc. More recently, etching compositions which comprise mixtures of an acid such as sulfuric acid and oxidizing agents such as hydrogen peroxide have been developed and utilized. The advantages of the peroxide sulfuric acid system include competitively low cost and in situ recovery of copper from the used etching composition in the form of copper sulfate or copper metal. The composition from which the copper has been recovered can be regenerated by replenishment of the hydrogen peroxide. Such etching compositions provide for the recovery of valuable copper and minimize the environmental burden otherwise arising from the disposition of used etching compositions. Various sulfuric acid/hydrogen peroxide etching compositions are described in, for example, U.S. Pat. Nos. 3,801,512, 4,130,454, 3,668,131 and 3,463,733.

It is an ongoing problem to bond organic materials to metal surfaces such as copper. When the bond between the metal surface and an organic material is exposed to heat, delamination may occur. Multilayer printed circuit boards (PCBs) are typically constructed by interleaving imaged conductive layers, such as one containing copper with non-conductive layers such as a partially cured B-stage resin (i.e., a prepreg) into a multilayer sandwich which is then bonded together by applying heat and pressure. The conductive layer, i.e., the copper circuitry, does not bond well to the non-conducted B-stage resin prepreg. Often, intermediate layers are used to bond the B-stage prepreg to the copper circuitry.

SUMMARY OF THE INVENTION

This invention relates to an aqueous etching composition for etching metallic copper comprising (a) an acid, (b) a copper complexing agent, (c) a metal capable of having a multiplicity of oxidation states which is present in one of its higher positive oxidation states and which metal forms a composition soluble salt, and (d) oxygen wherein the concentration of the higher positive oxidation state metal in the composition is greater than about 4 grams/liter of composition.

The invention also relates to a process for etching metallic copper comprising contacting the surface of a copper substrate with the aqueous etching compositions of the invention. A method of regenerating a spent aqueous etching composition of the invention which has been used for etching metallic copper also is described.

DESCRIPTION OF THE PREFERRED EMBODIMENTS

Aqueous etching compositions of the present invention which are useful for etching metallic copper comprise (a) an acid, (b) a copper complexing agent, (c) a metal capable of having a multiplicity of oxidation states which is present in one of its higher positive oxidation states and which metal forms a composition soluble salt, and (d) oxygen, wherein the concentration of the higher positive oxidation state metal in the composition is greater than about 4 grams per liter of composition.

The acid which is included in the aqueous etching compositions may be any acid or mixture of acids which is strong enough to etch the copper or copper alloy in the presence of the other ingredients in the etching composition. The etching compositions generally will contain from about 20 to about 400 grams of acid, preferably from about 50 to about 150 grams of acid per liter of composition. Sufficient acid should be present in the etching composition to provide a pH of from 0 to about 6, or more often, from about 0 to about 3.

The acid utilized in the etching compositions of the present invention may be mineral acids, organic acids or mixtures thereof. Examples of mineral acids include sulfuric acid, perchloric acid, hydrochloric acid, fluoroboric acid, phosphoric acid, etc. Sulfuric acid is a particularly preferred mineral acid. Examples of organic acids Which may be utilized include carboxylic acids such as acetic acid, alkane sulfonic acids, alkanol sulfonic acids, or mixtures thereof.

The alkane sulfonic acids may be represented by the following formula, R—SO$_3$H, wherein R is an alkyl group containing from about 1 to about 18, or from about 1 to about 12 carbon atoms. Examples of alkane sulfonic acids include methane sulfonic acid, ethane sulfonic acid, propane sulfonic acid, butane sulfonic acid, pentane sulfonic acid, hexane sulfonic acid, decane sulfonic acid and dodecane sulfonic acid.

The alkanol sulfonic acids may be represented by the following formula: $(C_nH_{2n+1})$—CH(OH)—$(CH_2)_m$—SO$_3$H wherein n is from 0 to about 10, m is from 1 to about 11 and the sum of m+n is from 1 up to about 12. The hydroxy group of the alkanol sulfonic acids may be a terminal or internal hydroxy group. Examples of useful alkanol sulfonic acids include hydroxyethyl sulfonic acid, hydroxypropyl sulfonic acid, hydroxybutyl sulfonic acid, hydroxypentyl sulfonic acid, hydroxyhexyl sulfonic acid, and hydroxydodecyl sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups having from 1 to about 18 carbon atoms and n is a positive integer between 1 and 6. The metal salts of such acids are prepared, for example, by dissolving a metal oxide in a hot concentrated aqueous composition of an alkane or alkanol sulfonic acid.

A second essential component of the compositions of the present invention is at least one complexing agent selected from the group consisting of urea and thiourea compounds, amidines, and imidazole thiones. Specific examples of urea compounds include urea, urea nitrate, urea oxalate, 1-acetylurea, 1-benzylurea, 1-butylurea, 1,1-diethylurea, 1,1-diphenylurea, 1-hydroxyurea, etc. Examples of useful urea compounds are found in Holtzman et al, U.S. Pat. No. 4,657,632, which is incorporated herein by reference.

The thiourea compounds may be represented by the Formula I:

where
$R^1$, $R^2$, $R^3$ and $R^4$ are each independently (1) H;

(2) alkyl or alkenyl groups having up to about 6 carbon atoms;

(3) aryl, aralkyl, or alkaryl groups having up to about 12 carbon atoms;

(4) cycloalkyl, cycloalkylalkyl, or alkylcycloalkyl groups having up to about 12 carbon atoms;

(5) $R^5$ C(X) where $R^5$ may be the same as groups (2) through (4) as defined above, and X is O or S; and (6) $CH_2OH$.

Mineral acid salts of the thiourea compounds may also be used.

The thiourea compound used in the present invention comprises either thiourea or the various art known derivatives, homologs, or analogs thereof. Compounds that may be employed in this respect comprise 2,4-dithiobiuret; 2,4,6-trithiotriuret; alkoxy ethers of isothiourea; thiocyanuric acid (trimer of thiourea); monalkyl or dialkyl thiourea, where the alkyl group comprises a lower alkyl group, having up to about four carbon atoms such as diethyl thiourea or monoethyl thiourea; saturated or unsaturated cyclic hydrocarbons mono- or disubstituted thioureas such as naphthyl thiourea, diphenyl thiourea, cyclohexyl thiourea and the like, where the cyclic hydrocarbons have up to about ten carbon atoms; the disulfide of thiourea; thio-imidol (the reaction product of thiourea and sodium hydroxide); thiocarbamic acid esters (the reaction products of thiourea and an alcohol comprising ROH where R is a saturated or unsaturated aliphatic or cyclic group having up to about ten carbon atoms) the oligomers of thiourea and formaldehyde, e.g., monomethylol, dimethylol, and trimethylol thioureas; S-alkyl pseudo thioureas (manufactured by the reaction of thiourea with an iodo lower alkane such as iodo methane where the lower alkyl group contains up to about five carbon atoms); thiocarbonic acid esters of thiourea and $R^5OH$, ($R^5$ as defined above) especially where $R^5$ is lower alkyl; the reaction product of a saturated or unsaturated aliphatic or cyclic organic acid having up to about 12 carbon atoms and especially the lower aliphatic monocarboxylic acid reaction products with thiourea e.g., acylthioureas, and the mineral acid salts of thiourea e.g., thiourea mono- or di-sulfate.

The imidazole-thiones useful in the baths of the invention include imidazole-2-thiones which are represented by the Formula II:

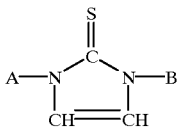

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety.

In one embodiment, the complexing agent is a 1,3-dialkylimidazole-2-thione compound (where A and B are each individually alkyl or cycloalkyl groups), and the thione compound may be unsymmetrical (A and B are different) or symmetrical (A and B are the same). Preferably, the complexing agents are unsymmetrical such as (where A is methyl or ethyl and B is an alkyl or cycloalkyl group containing from 3 to 6 carbon atoms). Preferably, when A is methyl, B is a $C_3-C_6$ alkyl or cycloalkyl group, and when A is ethyl, B is a $C_4-C_6$ alkyl or cycloalkyl group. An example of an unsymmetrical compound is 1-methyl-3-propylimidazole-2-thione.

Alternatively, symmetrical 1,3-dialkylimidazole-2-thione compounds may be used and the dialkyl groups are the same alkyl or cycloalkyl groups containing from 1 to 6 carbon atoms. An example of this class of complexing agents is 1,3-dimethylimidazole-2-thione.

The imidiazole-2-thione complexing agents are described in U.S. Pat. No. 5,554,211, issued to Bokisa et al. This patent is incorporated herein by reference for its disclosure of the thiones.

Another useful copper complexing agent is at least one amidine compound. The amidine compounds may Le characterized by the Formula III:

and the acid salts thereof wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl group.

The acid salts include salts such as the formates, acetates, hydrochlorides, carbonates, etc. of such amidines. The aliphatic and alkyl groups contain from one to about 10 or more carbon atoms, whereas the alicyclic and aromatic (or aryl) groups contain from about 6 to about 20 or more carbon atoms, and the heterocyclic groups contain from about 4 to about 20 carbon atoms.

Examples of such amidines are as follows. The list is exemplary only and is not to be considered as a limitation on the above formula.

| Formula | Name |
|---|---|
| R | |
| Hydrogen  H—C(=NH)NH$_2$ | formamidine |
| Hydroxyl  HO—C(=NH)NH$_2$ | isourea |
| Aliphatic  CH$_3$C(=NH)NH$_2$ | ethanamidine |
| CH$_2$CH$_3$ | 4-ethylhexanamidine |
| CH$_3$CH$_2$CH—CH$_2$CH$_2$C(=NH)NH$_2$ | |
| Alicyclic  C$_6$H$_{11}$—C(=NH)NH$_2$ | Cyclohexanecarboximidine |
| 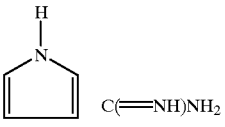 | Pyrrole-2-carboxamidine |
| Heterocyclic  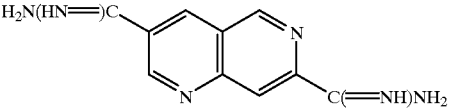 | 2.6-diazonaphthalene-3,7-Dicarboxamide |
| Aromatic  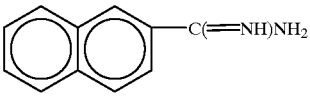 | 2-naphthamidine |
| C$_6$H$_5$—C(=NH)NH$_2$ | Benzamidine |
| Amino  H$_2$N—C(—NH)NH$_2$ | guanidine |
| Aminoalkyl  H$_2$NCH$_2$CH$_2$C(=NH)NH$_2$ | 1-aminopropanamidine |
| Amidinoalkyl  H$_2$N(HN=)C(CH$_2$)$_3$C(=NH)NH$_2$ | pentanediamidine |
| Amidino  H$_2$N(NH=)C—C(=NH)NH$_2$ | ethanediamidine |
| Amidinoaryl  H$_2$N(HN=)C—C$_6$H$_4$—C(=NH)NH$_2$ | 1,4-benzenedicarboxamidine |
| Carboxyalkyl  H$_2$N(HN=)C(CH$_2$)$_3$COOH | 4-carbaminidoylbutanoic acid |
| R' = | |
| Aliphatic  CH$_3$NHC(=NH)NH$_2$ | methyl guanidine |
| Alicyclic   | Cyclohexyl guanidine |
| Amidino  H$_2$N(HN=)C—NH—C(=NH)NH$_2$ | biguanide |
| Aminoalkyl  H$_2$N(CH$_2$)$_4$NH—C(=NH)NH$_2$ | aminobutylguanidine |
| Carboxyalkyl  H$_2$N(HN=)C—NH—CH$_2$COOH | 3-guanidinoacetic acid |
| H$_2$N(HN=)C—NH—(CH$_2$)$_2$COOH | 3-guanidinobutanoic acid |
| amidoalkyl  H$_2$N(HN=)C—NH—CH$_2$CH$_2$CONH$_2$ | 3-guanidino propionamide |
| Heterocyclic  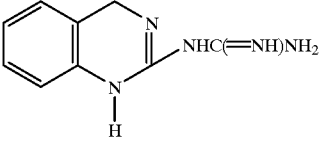 | 2-guanidinobenzimidazole |

The amount of the complexing agent included in the etching compositions may be varied over a wide range such as from about 5 g to about 200 grams per liter of composition. More often the baths will contain from about 5 to 120 grams/liter and preferably from about 15 to about 75 grams of the complexing agent per liter of composition. Preferably the complexing agent is thiourea or 1-methyl-3-propyl imidazole-2-thione (PTI).

When the solubility of the complexing agent in the etching composition is low, a cosolvent may be added to solubilize the complexing agent and thereby enhance its activity in the etching composition. Suitable cosolvents include water-miscible solvents such as alcohols, (e.g., ethanol), glycols (e.g., ethylene glycol), alkoxy alkanols (e.g., 2-ethoxy ethanol), ketones (e.g., acetone), aprotic solvents (e.g., dimethyl formamide, dimethyl sulfoxide, acetonitrile, etc.), etc.

Another essential component of the etching compositions of the present invention is one or more metals capable of having a multiplicity of oxidation states, which metal is present in one of its higher positive oxidation states, and which metal forms a composition soluble salt. Examples of such metals include tin, lead, platinum, and palladium which have positive oxidation states of +2 and +4; bismuth and antimony which have positive oxidation states of +3 and +5; and cerium and titanium which have positive oxidation states of +3 and +4. Particularly preferred examples of higher oxidation state metals useful in the present invention include tin (+4), bismuth (+5), lead (+4) and cerium (+4). Tin present in a composition as stannic ion is most preferred.

The aqueous compositions of the present invention containing one or more of the above described metals in the higher positive oxidation state can be prepared, for example, by dissolving a metal oxide or sulfate wherein the metal in the metal oxide or sulfate is in its higher positive oxidation state in the aqueous acid composition. For example, an aqueous etching composition containing stannic ions can be produced by dissolving a colloidal dispersion of tin (IV) oxide in sulfuric acid and water. Alternatively, tin (IV) sulfate can be dissolved in the aqueous acid composition.

The etching compositions of the present invention contain more than 4 grams per liter of the metal in the higher oxidation state. As the etching process proceeds, stannic ion is reduced to stannous ion, and the copper is removed from the copper substrate is incorporated into the etching composition as a copper complex formed by reaction of the dissolved cupric ions and the copper complexing agent present in the composition. The stannous ion is reconverted to stannic ion by oxidation with air.

Another essential component of the etching compositions of the present invention is dissolved oxygen or air. Typically, the amount of oxygen present in a composition will range from about 1 to about 15 mgs per liter of composition, more often, from about 5 to about 9 mgs per liter of composition. The amount of dissolved oxygen in the composition should be an amount sufficient to oxidize at least part of the metal present in the composition in its lower oxidation state to a higher oxidation state; for example, to oxidize stannous ion to stannic ion.

In one preferred embodiment of the present invention, oxygen or air is used as the exclusive oxidizing agent, and the etching composition is free of other typical oxidizing agents such as peroxides, persulfates, peroxysulfates, permanganates, chromic acid, and metals other than those specifically identified above.

In one embodiment, the amount of oxygen present in the aqueous etching compositions is sufficient to maintain the concentration of stannous ions in the compositions to less than about 2 grams per liter of composition by oxidation of the stannous ion to stannic ion. In another embodiment, the concentration of dissolved copper in the etching compositions should be maintained below about 2.5 grams of copper per liter of composition. As will be described more fully below, the copper concentration can be reduced by precipitating the copper complex from the used (spent) etching composition.

The etching compositions of the present invention may be prepared by dissolving the above-described components in water in any order. Generally, the components will dissolve in water at ambient temperatures, but it may be helpful in some instances if the mixture is prepared at slightly higher temperatures.

The etching composition also may include one or more surfactants compatible with each of the metal salts, the acids and the complexing agent. The etching composition may optionally contain at least one surfactant in a concentration from about 0.01 to about 100 grams per liter of bath and more preferably from about 0.05 to about 20 grams per liter of bath. The surfactant may be at least one surfactant including amphoteric, nonionic, cationic, or anionic surfactants; or mixtures thereof. More often, the surfactant is at least one cationic or anionic surfactant; or mixtures thereof. The nonionic surfactants are preferred.

A variety of nonionic surfactants include the condensation products of ethylene oxide and/or propylene oxide with compounds containing a hydroxy, mercapto or amino group. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants include ether containing surfactants which may be produced by treating fatty alcohols or alkyl or alkoxy substituted phenols or naphthols with excess ethylene oxide or propylene oxide. The alkyl group may contain from about 14 to about 24 carbon atoms and may be derived from a long chain fatty alcohol, such as oleyl alcohol or stearyl alcohol. Nonionic polyoxyethylene compounds are described in U.S. Pat. No. 3,855,085, which is incorporated by reference. Polyoxyethylene compounds are available commercially under the general trade designations "Surfynol" by Air Products and Chemicals, Inc. of Wayne, Pa., under the designation "Pluronic" or "Tetronic" by BASF Wyandotte Corp. of Wyandotte, Mich., and under the designation "Surfonic" by Huntsmern Corporation of Houston, Tex.

Alkoxylated amine, long chain fatty amine, long chain fatty acid, alkanol amines, diamines, amides, alkanol amides and polyglycol type surfactants known in the art are also useful. One type of amine useful surfactant is the group of surfactants obtained by the addition of a mixture of propylene oxide and ethylene oxide to diamines. More specifically, compounds formed by the addition of propylene oxide to ethylene diamine followed by the addition of ethylene oxide are useful and are available commercially from BASF Wyandotte, Ind. Chemical Group under the general trade designation "Tetronic".

Carbowax-type surfactants, which are polyethylene glycols having different molecular weights, also are useful. Other known nonionic glycol derivatives, such as polyalkylene glycol ethers and methoxy polyethylene glycols, are available commercially and may be utilized as surfactants.

Ethylene oxide condensation products with fatty acids also are useful nonionic surfactants. Many of these are available commercially under the general tradename "Ethofat" from Armak Ind. Examples of these surfactants include condensates of coco acids, oleic acid, etc. Ethylene oxide condensates of fatty acid amides, e.g., oleamide, also are available from Armak Ind.

Polyoxyalkylated glycols, phenols and/or naphthols may also be included. Many of these condensates are available commercially under such trade names as "Tween" from ICI America, "Triton" from Rohm & Haas Co., "Tergitol" from Union Carbide, and "Igepal" from General Aniline and Film Corp.

The surfactants utilized in the atching compositions also may be amphoteric surfactants. The preferred amphoteric surfactants include betaines and sulfobetaines, and sulfated or sulfonated adducts of the condensation products of ethylene oxide and/or propylene oxide with an alkyl amine or diamine. Examples of these surfactants include lauryldimethylammonium betaine, stearyl dimethylammonium betaine, a sulfated adduct of an ethoxylated alkylamine, Triton QS-15 (Rohm & Haas Co.), a sodium salt of a sulfonated lauric derivative, Miranol HS, and a sodium salt of a sulfonated oleic acid, Miranol OS.

Cationic surfactants also are useful in the etching compositions and may be selected from higher alkyl amine salts, quaternary ammonium salts, alkyl pyridinium salts and alkyl imidazolium salts. Examples of the above described cationic surfactants, in the form of salts, are lauryltrimethylammonium salt, stearyltrimethylammonium salt, octadecyldimethylethylammonium salt, dimethylbenzyllaurylammonium salt, octadecyldimethylbenzylammonium salt, triethylbenzylammonium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

Cationic surfactants obtained by condensation of various amounts of ethylene oxide or propylene oxide with primary fatty amines are useful and are prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 30 carbon atoms include saturated, as well as unsaturated, aliphatic amines such as octyl amine, decyl amine, lauryl amine, stearyl amine, oleyl amine, myristyl amine, palmityl amine, dodecyl amine, and octadecyl amine. Alkoxylated amines, e.g., coconut fatty amine, stearyl amine, and tallow amine, are available from the Armak Chemical Division of Akzona, Inc., Chicago, Ill., under the general trade designation "Ethomeen". Specific examples of such products include "Ethomeen C/15" "Ethomeen C/20", "C/25", "Ethomeen S/15" and "S/20" and "Ethomeen T/15" and "T/25". Commercially available examples of the alkoxylated diamines include "Ethoduomeen T/13" and "T/20" which are ethylene oxide condensation products of N-tallow trimethylene diamine containing about 3 and 10 moles of ethylene oxide per mole of diamine respectively.

The amine ethoxylate surfactants exhibit the characteristics of both cationic and nonionic surfactants with the nonionic properties increasing at the higher levels of ethoxylation. That is, as the level of ethoxylation increases, the ethoxylated amine behaves more like a nonionic surfactant. Useful surfactants are available commercially such as from Texaco Chemical Company under the trade designation "M-300 Series", such as M-302, M-305, M-310, M-315 and M-320 which contain a total to 2, 5, 10, 15 and 20 moles of ethylene oxide respectively.

The surfactants also may be anionic surfactants. Examples of useful anionic surfactants include sulfated alkyl alcohols, sulfated lower ethoxylated alkyl alcohols, and their salts such as alkali metal salts. Examples of such surfactants include sodium lauryl sulfate (Duponol C or QC from DuPont), sodium mixed long chain alcohol sulfates available from DuPont under the designation Duponol WN, sodium octyl sulfate available from Alcolac, Ltd. under the designation Sipex OLS, Sodium tridecyl ether sulfate (Sipex EST), sodium lauryl ether sulfate (Sipon ES), magnesium lauryl sulfate (Sipon LM), the ammonium salt of lauryl sulfate (Sipon L-22), diethanolamino lauryl sulfate (Sipon LD), sodium dodecylbenzene sulfonate (Siponate DS), etc.

The following examples illustrate the preparation of the etching compositions of the present invention. Unless otherwise indicated in the following examples and elsewhere in the written description and claims, all parts and percentages are by weight, and temperatures are in degrees centigrade.

EXAMPLE 1

A composition containing 10 grams of stannic ion per liter of composition is produced by dissolving 83 grams per liter of a 15% tin (IV) oxide colloidal dispersion (purchased from Alfa Aesar, product code 40026), 60 grams of thiourea per liter of composition, 100 grams of sulfuric acid per liter of composition, and water. Oxygen is dissolved in the composition by bubbling oxygen through the mixture.

EXAMPLE 2

The procedure of Example 1 is repeated except that an equivalent amount of 1-methyl-3-propyl-imidazole-2-thione (PTI) is substituted for the thiourea.

EXAMPLE 3

The procedure of Example 1 is repeated except that the sulfuric acid is replaced by an equivalent amount of methane sulfonic acid.

EXAMPLE 4

The procedure of Example 1 is repeated except that the sulfuric acid is replaced by an equivalent amount of acetic acid.

EXAMPLE 5

The procedure of Example 1 is repeated except that the sulfuric acid is replaced by an equivalent amount of hydrochloric acid.

EXAMPLE 6

The procedure of Example 1 is repeated except that the tin (IV) is replaced by an equivalent amount of bismuth (V).

The etching compositions of the present invention are useful for etching and removing copper from metallic copper surfaces, and the used or spent copper etching composition can be renewed inexpensively and with relative ease. No new species are generated during the etching process except for water and the copper complex. In one embodiment, the composition is continuously renewed by the presence of the oxygen which oxidizes any metal present in a lower oxidation state which is generated during the etching process to the metal in a higher oxidation state. As noted earlier, the metal in the higher oxidation state is a critical component of the present invention. For example, when the metal in the etching composition is tin, the etching composition originally contains stannic ion formed by the dissolution of stannic compound such as stannic oxide or stannic sulfate. As the etching process proceeds, stannic ion is reduced to stannous ion and copper metal is oxidized to cupric ions according to the following equation $$Cu^0 + Sn^{+4} \rightarrow Cu^{+2} + Sn^{+2}$$

The cupric ions are dissolved in the etching composition and form a soluble complex with the complexing agent. Oxygen present in the etching composition then oxidizes the stannous ion to stannic ion as follows.

$$Sn^{+2} + O_2(g) \rightarrow Sn^{+4} + 2OH^-$$

The hydroxyl ions react with the sulfuric acid as follows.

$$H_2SO_4 + 2OH^- \rightarrow H_2O + SO_4^{-2}$$

As copper ion begins to build up in the working etching composition, the copper can be removed by precipitating the copper complex such as by, for example, lowering the temperature of the used etching composition. Copper complexing agent can be easily added to the working etching composition to restore the concentration of the copper complexing agent to the desired level.

Copper can be recovered from the copper complex which is precipitated as a crystalline salt (e.g., copper thiourea sulfate) by electrowinning as described in more detail in U.S. Pat. No. 5,211,831 (Vitale et al), which patent is hereby incorporated by reference. The complexing agent (e.g., thiourea) also can be recovered and reused in the etching composition.

Another procedure for removing dissolved copper from the working etching composition is to subject the spent etching composition to filtration using, for example, a 0.1 micron filter to remove any colloidal stannic oxide, and the filtrate is then passed through a column containing a chelating resin (e.g., a bis-picolylamine) to remove copper. The resulting filtrate is essentially free of copper but retains the original thiourea and sulfuric acid. The filtered colloidal stannic oxide can then be recombined with the composition, and when air is bubbled through this resulting composition, the original starting chemistry has been restored. Only atmospheric oxygen and a small amount of acid has been consumed.

The utility of the copper etching compositions of the present invention is illustrated by the following examples.

EXAMPLE A

A 3 inch by 3 inch, 1 ounce High Temperature Elongation (HTE) copper laminate is cleaned in an alkaline cleaner, rinsed with water, and exposed to a spray of the etching composition of Example 1 for 45 seconds at ambient temperature. The copper laminate is then rinsed using water, dried and examined using a scanning electron microscope (SEM) with an attached Energy Dispersive x-ray Spectrometer. The resulting surface is found to have a morphology which is etched, and the surface does not appear to contain an immersion tin coating.

EXAMPLE B

The procedure of Example A is repeated wherein the copper laminate is weighed before and after treatment. The amount of copper removed from the side exposed to the spray is about 82 mg. This corresponds to an average 80μ inch copper removal which is similar to the average copper removed by a sulfuric acid/peroxide or sodium persulfate copper etch.

EXAMPLE C

The procedure of Example A is repeated, and the sprayed composition is captured in a separate container. Examination of the captured composition demonstrates that copper is dissolved, and that stannous ion has formed. Bubbling air through the captured composition quickly converts the stannous ion back to the stannic oxidation state.

EXAMPLE D

The procedure of Example A is repeated except that the etching composition of Example 2 is utilized.

EXAMPLE E

The procedure of Example A is repeated except that the etching composition of Example 3 is utilized.

EXAMPLE F

The procedure of Example A is repeated except that the etching composition of Example 4 is utilized.

EXAMPLE G

The procedure of Example A is repeated except that the etching composition of Example 5 is utilized.

EXAMPLE H

The procedure of Example A is repeated utilizing the same etching composition on several copper laminates until the copper concentration is about 2 grams per liter of composition. The resulting composition is chilled, and copper complex is precipitated. Thiourea is added back to the etching composition to restore the original chemistry.

EXAMPLE I

The procedure of Example A is repeated except that the temperature of the etching composition is maintained at about 110° F. In this Example, similar results are obtained in 20 seconds.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An aqueous etching composition for etching metallic copper comprising:
    (a) an acid,
    (b) a copper complexing agent,
    (c) a metal capable of having a multiplicity of oxidation states which is present in one of its higher positive oxidation states and which metal forms a composition soluble salt, and
    (d) oxygen,
wherein the concentration of the higher positive oxidation state metal in the composition is greater than about 4 grams per liter of composition.

2. The composition of claim 1 wherein the metal (c) also is present in a lower positive oxidation state, and the concentration of this lower oxidation state metal is less than about 2 grams per liter of composition.

3. The composition of claim 1 also containing copper, and the concentration of copper is less than about 2.5 grams per liter of composition.

4. The composition of claim 1 wherein the acid is a mineral acid.

5. The composition of claim 1 wherein the acid is an organic acid.

6. The composition of claim 1 wherein the acid is sulfuric acid.

7. The composition of claim 1 wherein the metal is selected from the group consisting of tin, bismuth, lead, and cerium.

8. The composition of claim 1 wherein the acid is sulfuric acid and the metal is tin.

9. The composition of claim 1 wherein the copper complexing agent is a thiourea or an imidazole-thione.

10. The composition of claim 1 containing greater than about 4 grams per liter of stannic ion.

11. The composition of claim 10 containing less than about 2 grams per liter of stannous ion.

12. An aqueous acid etching composition for etching metallic copper comprising:
    (a) sulfuric acid,
    (b) a copper complexing agent which is a urea, a thiourea, an amidine or an imidazole-thione,
    (c) a metal selected from tin, bismuth, or cerium present in its higher positive oxidation state, and
    (d) oxygen,
wherein the concentration of the higher positive oxidation state metal is greater than about 4 grams per liter of composition.

13. The composition of claim 12 containing from about 50 to about 150 grams of sulfuric acid per liter of composition.

14. The composition of claim 12 wherein the metal is tin.

15. The composition of claim 12 containing from about 10 to about 120 grams of the copper complexing agent per liter of composition.

16. An aqueous etching composition for etching metallic copper comprising:
   (a) an acid,
   (b) a copper complexing agent which is a urea, a thiourea, an amidine, or an imidazole-thione,
   (c) greater than about 4 grams of stannic ions per liter of composition,
   (d) less than about 2 grams of stannous ions per liter of composition, and
   (e) oxygen.

17. The composition of claim 16 also containing less than about 2.5 grams of copper per liter of composition.

18. The composition of claim 16 containing from about 50 to about 150 grams of sulfuric acid per liter of composition.

19. A process for etching copper comprising contacting the surface of a copper substrate with the aqueous etching composition of claim 1.

20. The process of claim 19 wherein the acid in the composition is a mineral acid.

21. The process of claim 19 wherein the acid in the composition is an organic acid.

22. The process of claim 19 wherein the acid in the composition is sulfuric acid.

23. The process of claim 19 wherein the metal is selected from the group consisting of tin, bismuth, lead, and cerium.

24. The process of claim 19 wherein the metal is tin.

25. The process of claim 19 wherein the a copper complexing agent is a thiourea or an imidazole-thione.

26. The process of claim 24 wherein the composition contains more than about 4 grams per liter of stannic ion.

27. The process of claim 26 wherein the composition also contains less than about 2 grams per liter of stannous ion.

28. The process of claim 19 wherein the composition contains from about 50 to about 150 grams per liter of sulfuric acid.

29. A process for preparing an aqueous acid etching composition for etching metallic copper which comprises mixing
   (a) an acid,
   (b) a copper complexing agent,
   (c) a metal capable of having a multiplicity of oxidation states and which is present in the mixture in one of its higher positive oxidation states, which metal forms a composition soluble salt,
   (d) oxygen, and
   (e) water, wherein the concentration of the higher positive oxidation state metal in the composition is greater than about 4 grams per liter of composition.

30. A method of regenerating a spent aqueous etching composition used for etching metallic copper comprising:
   (a) an acid,
   (b) a copper complex,
   (c) a metal capable of having a multiplicity of oxidation states and which is present in the composition in one of its higher positive oxidation states, and
   (d) dissolved oxygen,
said process comprising removing the copper complex formed during the etching process by crystallization or by resin exchange.

31. Metallic copper, the surface of which has been etched by contact with the aqueous acid etching composition of claim 1.

* * * * *